(12) United States Patent
Sato (10) Patent No.: US 10,003,313 B2
(45) Date of Patent: Jun. 19, 2018

(54) AMPLIFIER

(71) Applicant: FUJITSU LIMITED, Kawasaki-shi, Kanagawa (JP)

(72) Inventor: Masaru Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/463,452

(22) Filed: Mar. 20, 2017

(65) Prior Publication Data

US 2017/0302235 A1    Oct. 19, 2017

(30) Foreign Application Priority Data

Apr. 15, 2016 (JP) .................... 2016-082245

(51) Int. Cl.
  *H03F 3/191*  (2006.01)
  *H03F 3/193*  (2006.01)
  *H03F 1/56*   (2006.01)

(52) U.S. Cl.
  CPC ............ *H03F 3/193* (2013.01); *H03F 1/56* (2013.01); *H03F 2200/18* (2013.01); *H03F 2200/222* (2013.01); *H03F 2200/294* (2013.01); *H03F 2200/387* (2013.01); *H03F 2200/465* (2013.01)

(58) Field of Classification Search
  CPC .................................. H03F 3/191; H03F 3/04
  USPC ......................... 330/302, 296, 285
  See application file for complete search history.

(56) References Cited

U.S. PATENT DOCUMENTS

| | | | | |
|---|---|---|---|---|
| 3,559,089 A | * | 1/1971 | Wolf et al. ............... | H03F 1/26 330/176 |
| 3,671,884 A | * | 6/1972 | Denny, Jr. ............... | H03F 1/48 330/10 |
| 3,805,164 A | * | 4/1974 | Callaway ............... | H03F 3/191 330/296 |
| 5,015,968 A | * | 5/1991 | Podell ............... | H03F 1/226 330/277 |
| 6,307,436 B1 | * | 10/2001 | Hau ............... | H03F 1/0238 330/149 |
| 6,657,497 B1 | * | 12/2003 | Yang ............... | H03F 1/08 330/277 |
| 2011/0121912 A1 | * | 5/2011 | Kim ............... | H03F 1/0288 333/124 |

FOREIGN PATENT DOCUMENTS

| | | |
|---|---|---|
| JP | 3-158008 | 7/1991 |
| JP | 2014-175675 | 9/2014 |
| WO | 2007/099622 | 9/2007 |

* cited by examiner

*Primary Examiner* — Henry Choe
(74) *Attorney, Agent, or Firm* — Fujitsu Patent Center (57) ABSTRACT

An amplification circuit has a field effect transistor, an input side matching circuit, an output side matching circuit, a capacitor, and a resistor. The input side matching circuit is connected between an input port and the source terminal of the field effect transistor and outputs an input signal that changes with a bias voltage as a center value. The output side matching circuit is connected between an output port and the drain terminal of the field effect transistor. The capacitor is connected between the gate terminal of the field effect transistor and a first reference voltage source. The resistor is connected between the gate terminal of the field effect transistor and the first reference voltage source.

3 Claims, 8 Drawing Sheets

// AMPLIFIER

CROSS-REFERENCE TO RELATED APPLICATION

This application is based upon and claims the benefit of priority of the prior Japanese Patent Application No. 2016-82245, filed on Apr. 15, 2016, the entire contents of which are incorporated herein by reference.

FIELD

The embodiments discussed herein are related to an amplifier.

BACKGROUND

Figure 1:
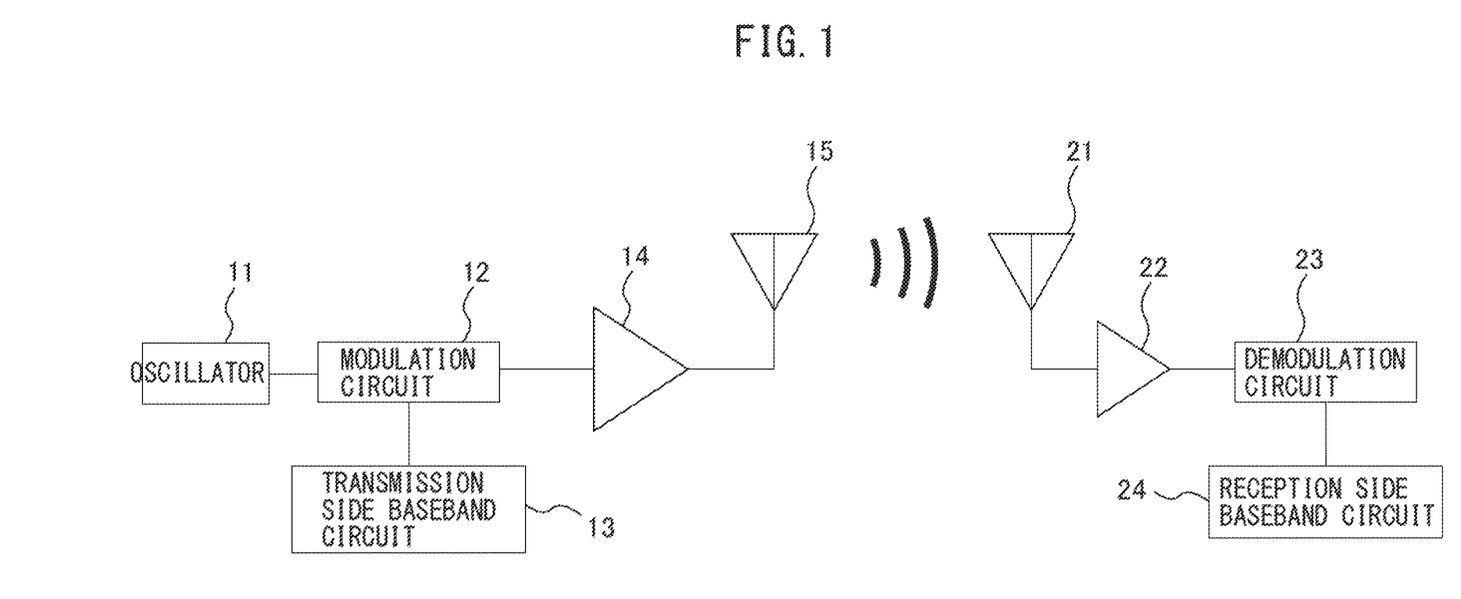
FIG. 1 is a block diagram of a wireless communication system.

FIG. 1 is a block diagram of a wireless communication system.

The wireless communication system has a transmission unit and a reception unit. The transmission unit has an oscillator 11 configured to generate a high-frequency signal used as a carrier signal, a transmission side baseband circuit 13, a modulation circuit 12 configured to modulate a baseband signal with a high-frequency signal, a high-output amplifier 14 configured to amplify a modulated signal, and a transmission antenna 15. The reception unit has a reception antenna 21, a low noise amplifier (LNA) 22 configured to amplify a received signal, a demodulation circuit 23 configured to demodulate an amplified received signal, and a reception side baseband circuit 24 configured to process a demodulated baseband signal. The configuration of the wireless communication system illustrated in FIG. 1 is widely known, and therefore detailed explanation is omitted.

As illustrated in FIG. 1, a received signal received by the reception antenna 21 in the reception unit is amplified by the low noise amplifier 22. Although the below explained amplifier relates to a low noise amplifier configured to amplify a high-frequency signal used in the wireless communication system such as in FIG. 1, the amplifier is not limited to the low noise amplifier.

The performance of a low noise amplifier is evaluated by the amplification gain, the noise characteristics, the frequency characteristics, and the dynamic range (magnitude of the power level that can be handled).

In the communication system such as in FIG. 1, when a transmitter is arranged in close proximity to a receiver, and when the transmitted power is reflected at a very short distance, etc., the situation of an excessive input may occurs in which electric power larger than the supposed electric power is input. In general, the low noise amplifier is formed by a field effect transistor (FET), such as a MES (Metal-Semiconductor) FET and a HEMT whose size is small, and therefore the low noise amplifier is easily destroyed by large electric power. Thus, if an excessive input occurs, the FET included in the low noise amplifier may be destroyed.

Figure 2:
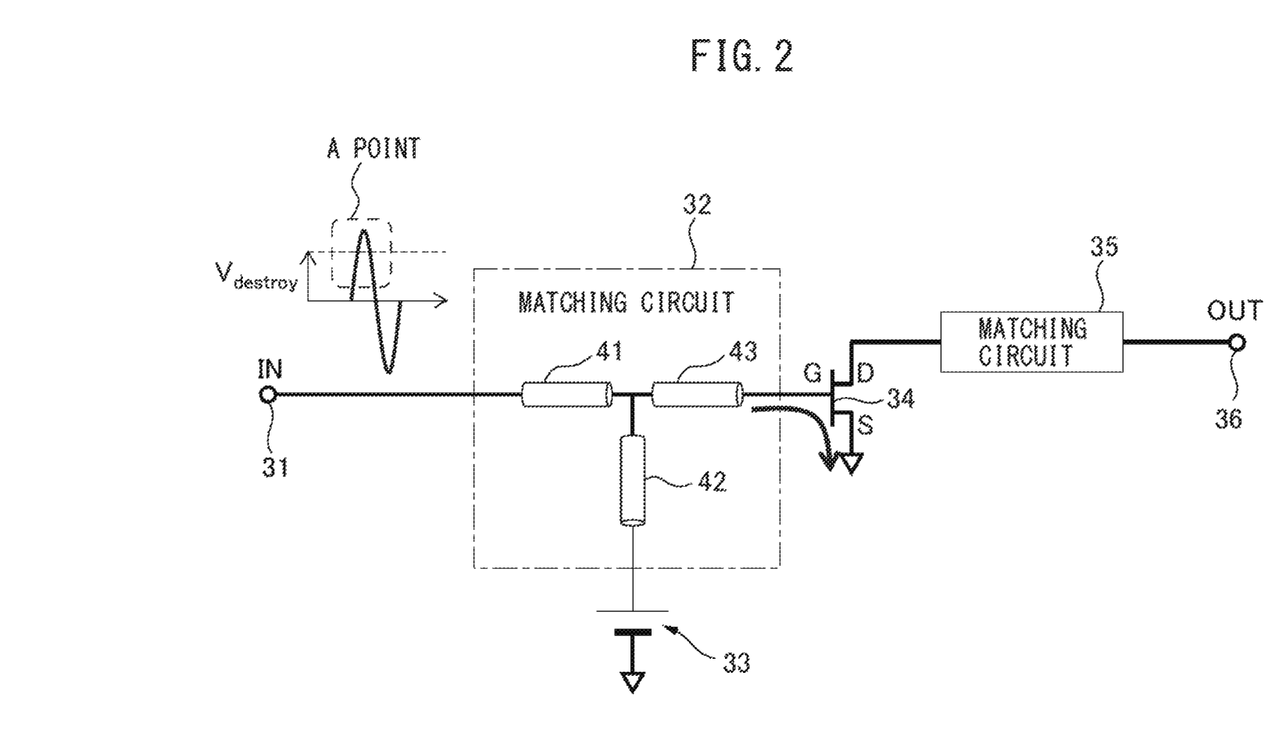
FIG. 2 is a diagram explaining a mechanism of destruction of a field effect transistor (FET) when large electric power is input to an amplifier formed by a FET whose source is grounded.

FIG. 2 is a diagram explaining a mechanism of destruction of a field effect transistor (FET) when large electric power is input to an amplifier formed by a FET whose source is grounded. In FIG. 2, for simplification of explanation, a sinusoidal wave is input to an amplifier.

As illustrated in FIG. 2, the amplifier has a FET 34, an input side matching circuit 32 connected between an input port 31 and the gate terminal of the FET 34, a voltage source 33, and an output side matching circuit 35 connected between an output port 36 and the drain terminal of the FET 34. The source of the FET 34 is connected to a ground GND (grounded). The input side matching circuit 32 has impedance elements 41, 42, and 43 connected as illustrated in FIG. 2, and performs the impedance matching between the input port 31 and the gate terminal of the FET 34. The impedance element 42 is connected to the ground (GND) via the voltage source 33 that outputs a gate bias voltage. Thus, the voltage at the node of the input side matching circuit 32 changes in accordance with the voltage of a high-frequency input signal with the gate bias voltage as a center value and is applied to the gate of the FET 34. The gate bias voltage is set so that the gain of amplification by the FET 34 becomes high and, for example, when a depression-type FET is used, the voltage is about −2 to 0 V. In the following explanation, e the input side matching circuit 32 and the voltage source 33 may be together referred to as an input side matching circuit.

The output side matching circuit 35 performs the impedance matching between the drain terminal of the FET 34 and the output port 36. Although not illustrated, the output side matching circuit 35 is provided with a voltage source that supplies a direct-current voltage in accordance with the necessity and the output side matching circuit 35 with the voltage source included may be referred to as an output side matching circuit.

The circuit configuration of the amplifier in FIG. 2 is a widely known circuit configuration in which the source of the FET 34 is grounded.

In the amplifier in FIG. 2, although when the input signal is small, no problem occurs, when the input signal becomes large and the voltage becomes positive as illustrated at A point, if the voltage level becomes higher than the on-voltage of a diode that is formed between the gate and the source of the FET 34, a current flows between the gate and the source. The current becomes large as the voltage value becomes large, and when the current exceeds a certain level, the gate of the FET 34 is destroyed. In particular, a high-frequency FET is formed by a fine gate, and therefore the high-frequency FET may be easily destroyed.

Although the destruction withstand voltage may be increased by using a large-size FET or a FET having a high withstand voltage, the withstand voltage is increased by devising a circuit.

Related Documents

[Patent Document 1] WO 2007/99622

[Patent Document 2] Japanese Laid Open Patent Document No. H3-158008

[Patent Document 3] Japanese Laid Open Patent Document No. 2014-175675

SUMMARY

In one aspect, an amplification circuit has a field effect transistor, an input side matching circuit, an output side matching circuit, a capacitor, and a resistor. The input side matching circuit is connected between an input port and the source terminal of the field effect transistor and outputs an input signal that changes with a bias voltage as a center value. The output side matching circuit is connected between an output port and the drain terminal of the field effect transistor. The capacitor is connected between the gate terminal of the field effect transistor and a first reference voltage source. The resistor is connected between the gate terminal of the field effect transistor and the first reference voltage source.

The object and advantages of the embodiments will be realized and attained by means of the elements and combination particularly pointed out in the claims.

It is to be understood that both the foregoing general description and the following detailed description are exemplary and explanatory and are not restrictive of the invention.

DESCRIPTION OF EMBODIMENTS

Figure 3:
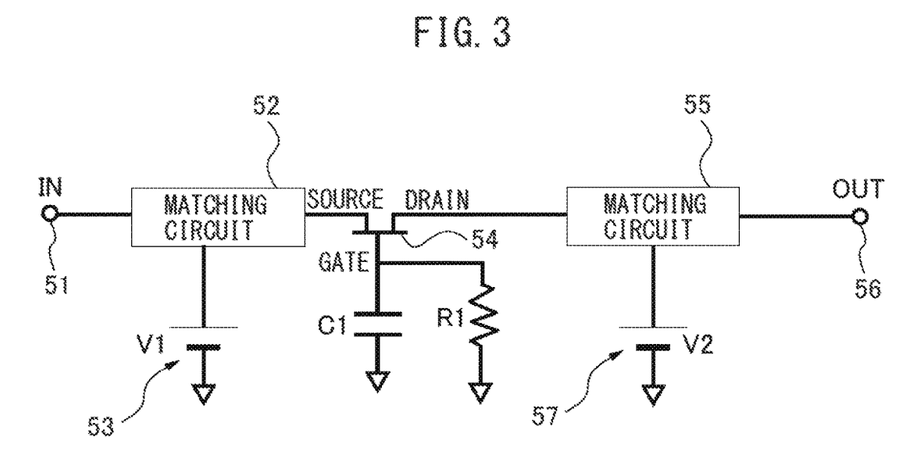
FIG. 3 is a diagram illustrating a configuration of an amplification circuit of a first embodiment.

FIG. 3 is a diagram illustrating a configuration of an amplification circuit of a first embodiment.

The amplification circuit of the first embodiment has a field effect transistor (FET) 54, an input side matching circuit 52, a voltage source 53, an output side matching circuit 55, a capacitor C1, a resistor R1, and a voltage source 57. The FET 54 is a field effect transistor, such as a MES transistor (Metal-Semiconductor Transistor) and a HEMT (High Electron Mobility Transistor). The input side matching circuit 52 is connected between an input port 51 and the source terminal of the FET 54 and receives supply of a bias voltage V1 from the voltage source 53 and outputs an input signal that changes with the bias voltage V1 as a center value. The input side matching circuit 52 performs impedance matching between the input port 51 and the source terminal of the FET 54. When the impedance of a signal system that is connected to the input port 51 coincides with the impedance of a source input of the FET 54, impedance matching is not performed. The output side matching circuit 55 is connected between an output port 56 and the drain terminal of the FET 54 and performs impedance matching therebetween. When the impedance of a signal system to which the output port 56 is connected coincides with the impedance of a drain output of the FET 54, the output side matching circuit 55 does not perform impedance matching. The output side matching circuit 55 receives supply of a bias voltage V2 from the voltage source 57 and outputs an output signal that changes with the bias voltage V2 as a center value. As described previously, the input side matching circuit 52 and the voltage source 53 may be together referred to as an input side matching circuit and the output side matching circuit 55 and the voltage source 57 are together referred to as an output side matching circuit.

The capacitor C1 is connected between the gate terminal of the FET 54 and the first reference voltage source (GND) and the resistor R1 is connected between the gate terminal of the FET 54 and the GND.

The amplification circuit of the first embodiment is a circuit in which the gate of the FET 54 is grounded and amplifies an input signal that is input to the source from the input port 51 via the input side matching circuit 52 and outputs the input signal to the output port 56 from the drain via the output side matching circuit 55. The operation of the amplification circuit of the first embodiment will be described later along with a second embodiment.

The amplification circuit of the first embodiment is used as the low noise amplifier (LNA) 22 of the reception unit of the wireless communication system in FIG. 1, and, the input port 51 corresponds to the output terminal of the reception antenna 21 and the output port 56 corresponds to the input node of the demodulation circuit 23. The corresponding relationship is also true with amplification circuits of second to fifth embodiments, to be described later.

Figure 4:
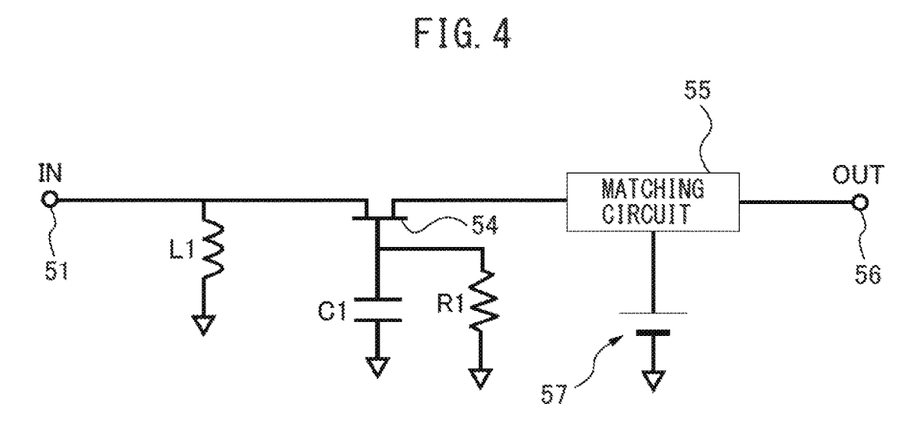
FIG. 4 is a diagram illustrating a configuration of an amplification circuit of the second embodiment.

FIG. 4 is a diagram illustrating a configuration of an amplification circuit of the second embodiment.

The amplification circuit of the second embodiment is obtained by implementing the input side matching circuit 52 and the voltage source 53 by an inductance element L1, such as a choke coil, in the amplification circuit of the first embodiment. The amplification circuit of the second embodiment is a circuit in which an input side matching circuit is not provided and the bias voltage V1 is 0 V. The input port 51 and the source terminal of the FET 54 are connected to the first reference voltage (GND) (grounded) in a direct-current (DC) manner by the inductance element L1, but it can be regarded that they are not grounded for the high-frequency component.

Figure 5A:
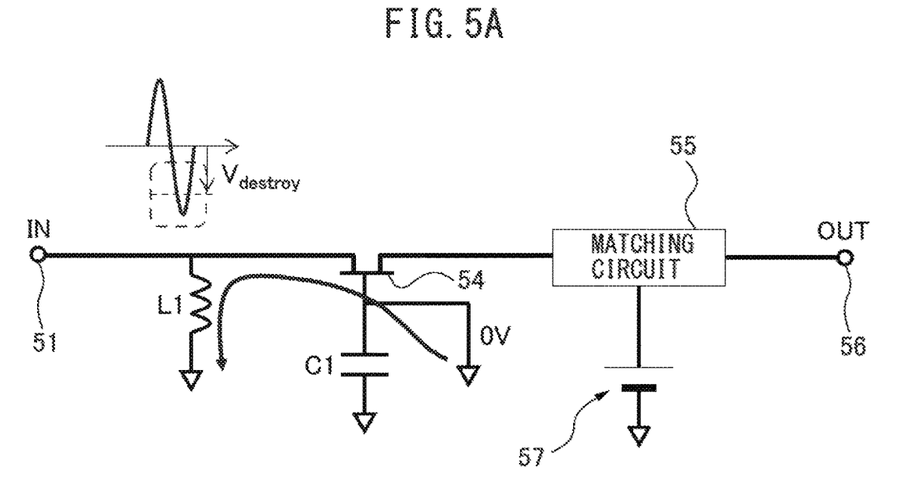
FIG. 5A is a diagram explaining the operation in a state where the resistor is removed.
Figure 5B:
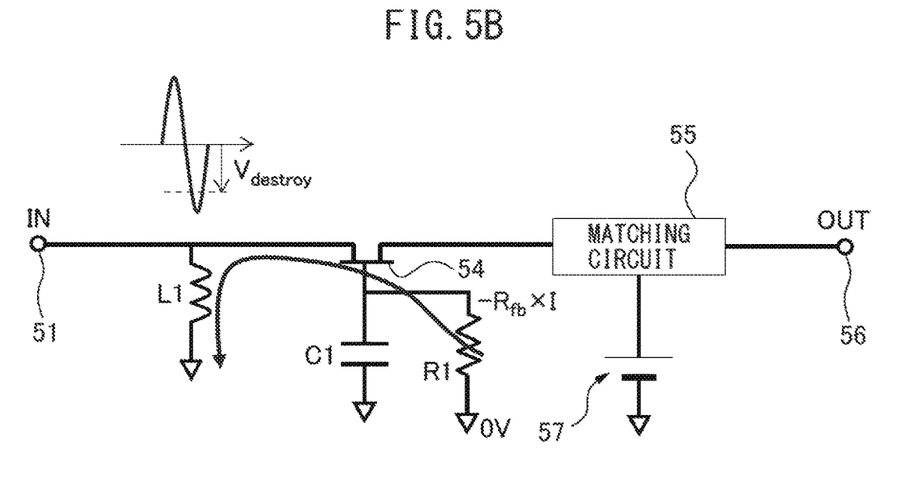
FIG. 5B is a diagram explaining the operation in a state where the resistor is provided of the amplification circuit of the second embodiment.

FIG. 5A and FIG. 5B are each a diagram explaining the operation and the effect of the amplification circuit of the second embodiment and FIG. 5A illustrates a state where the resistor R1 is removed and FIG. 5B illustrates a state where the resistor R1 is provided of the amplification circuit of the second embodiment.

As described previously, the amplification circuits of the first and second embodiments ground the gate of the FET 54 and inversely amplify an input signal and output the input signal as an output signal. The range (dynamic range) of an input signal in which amplification can be performed is specified and, for example, when a positive voltage level that exceeds the dynamic range is input, the output signal saturates and become a fixed level. As illustrated in FIG. 5A and FIG. 5B, when a negative voltage level that considerably exceeds the dynamic range is input, the voltage between the gate and the source of the FET 54 may become a voltage higher than the on-voltage of the diode that is formed between the gate and the source. If the gate is directly connected to the GND as in FIG. 5A, a large forward current flows from the GND via the gate and the source (gate-source diode). When the negative voltage level of an input signal becomes lower than a level $V_{destroy}$ that destroys the FET 54, a large forward current flows and destroys the FET 54. On the other hand, when the resistor R1 is provided as illustrated in FIG. 5B, by a forward current that flows from the GND via the gate and the source (gate-source diode), a voltage drop of $-R_{fb} \times I$ occurs at the gate and the voltage between the gate and the source becomes lower, and therefore the FET 54 becomes less apt to be destroyed. In other words, the negative voltage level of an input signal, which destroys the FET 45, substantially becomes further lower than the level $V_{destroy}$.

FIG. 5A and FIG. 5B are each an example of the configuration of the amplification circuit of the second embodiment and in the configuration of the amplification circuit of the second embodiment also, the FET becomes less apt to be destroyed as explained above.

In the amplification circuits of the first and second embodiments, the capacitance value of the capacitor C1 is set to a value so that the impedance becomes low for the target signal frequency. Thus, even if the resistor R1 is provided, the gate of the FET 54 is grounded via the capacitor C1, and therefore the high-frequency characteristics, such as the gain and the noise figure, are not deteriorated.

As described above, the resistor R1 serves so as to lower the gate voltage when an excessive input is input. On the other hand, when the input signal changes from an excessive input state (high negative voltage) to a level close to zero, it is desirable to immediately return from the voltage-dropped state to the state where the normal bias voltage is applied in order to bring the state where the predetermined amplification can be performed. Thus, it is desirable to reduce the time taken to return from the voltage-dropped state due to an excessive input to the state where the normal bias voltage is applied. The recovery time is determined by a time constant τ of a capacitance value $C_{gate}$ of the capacitor C1 and the resistance value $R_{fb}$ of the resistor R1, and $C_{gate}$ and $R_{fb}$ are determined so that a predetermined recovery time is obtained.

Figure 6A:
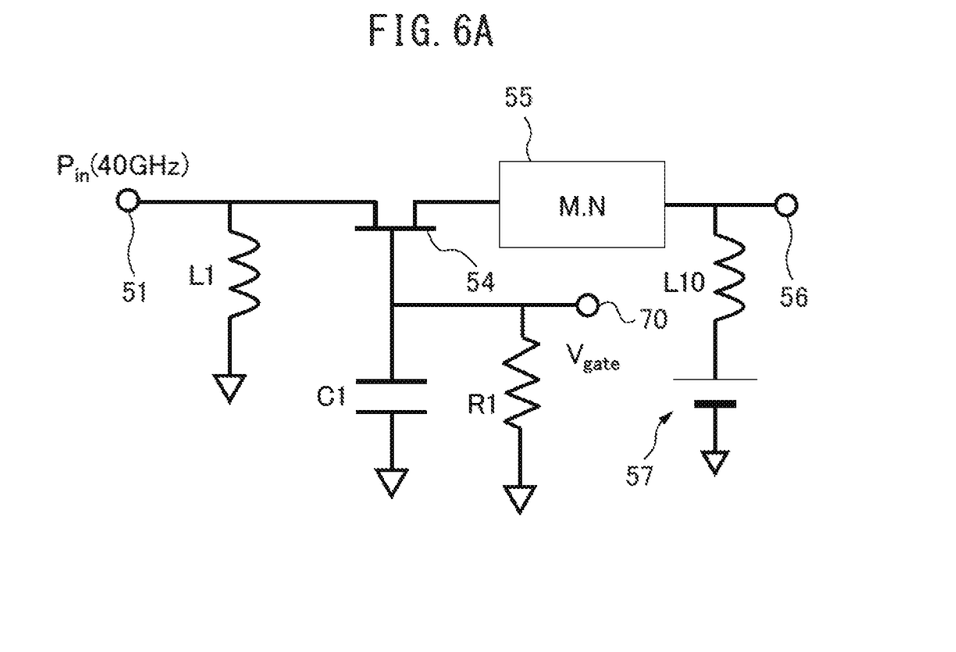
FIG. 6A is explaining processing to determine a resistance value and capacitance value in the amplification circuit of the second embodiment, and illustrates a circuit configuration for measurement.
Figure 6B:
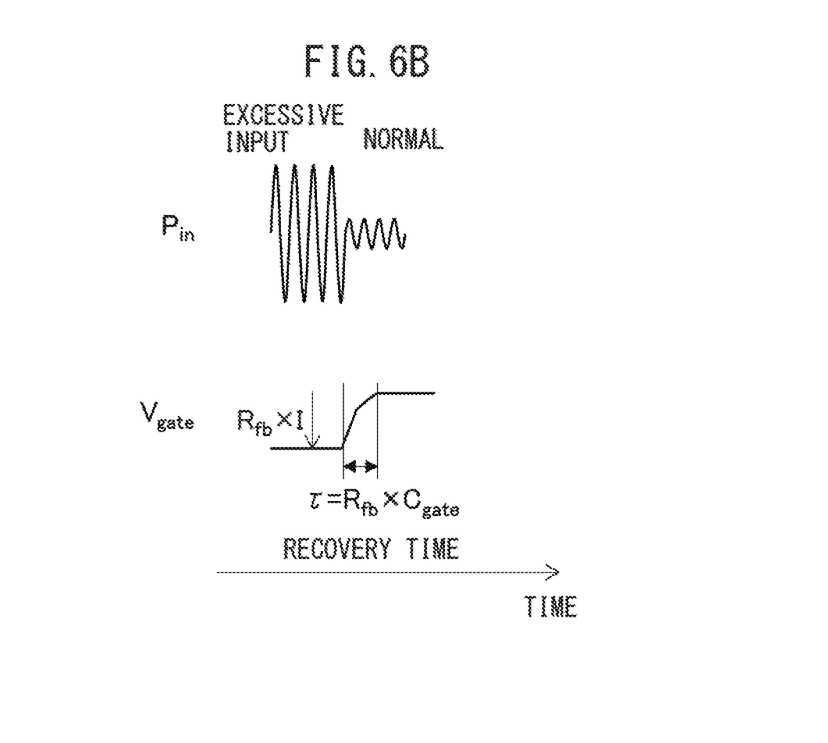
FIG. 6B is explaining processing to determine a resistance value and capacitance value in the amplification circuit of the second embodiment, and is a time chart indicating a change in the input signal and in the gate voltage.

FIG. 6A and FIG. 6B are diagrams explaining processing to determine $C_{gate}$ and $R_{fb}$ in the amplification circuit of the second embodiment and FIG. 6A illustrates a circuit configuration for measurement and FIG. 6B is a time chart indicating a change in the input signal and in the gate voltage.

As illustrated in FIG. 6A, in the amplification circuit of the second embodiment, a terminal 70 which measures a gate voltage $V_{gate}$ of the FET 54 is provided. The output side matching circuit 55 is indicated by M. N and an inductance element L10 is provided between a connection node of the output side matching circuit 55 and the output port 56, and the power source 57, in order to set a direct-current voltage level at the output port 56.

As illustrated in FIG. 6B, when an input signal $P_{in}$ of 40 GHz is a sinusoidal wave having a large amplitude, which is an excessive input, the current I flows between the gate and the source due to the excessive input and the gate voltage $V_{gate}$ enters a state of being decreased by $R_{fb} \times I$. If the input signal $P_{in}$ changes from the state into a normal signal having a small amplitude, the voltage $V_{gate}$ gradually increases and the recovery time τ is represented by $R_{fb} \times C_{gate}$. $C_{gate}$ and $R_{fb}$ are determined so that the recovery time τ required in the amplification circuit is obtained. $C_{gate}$ and $R_{fb}$ in the amplification circuit of the first embodiment are also determined similarly.

Figure 7:
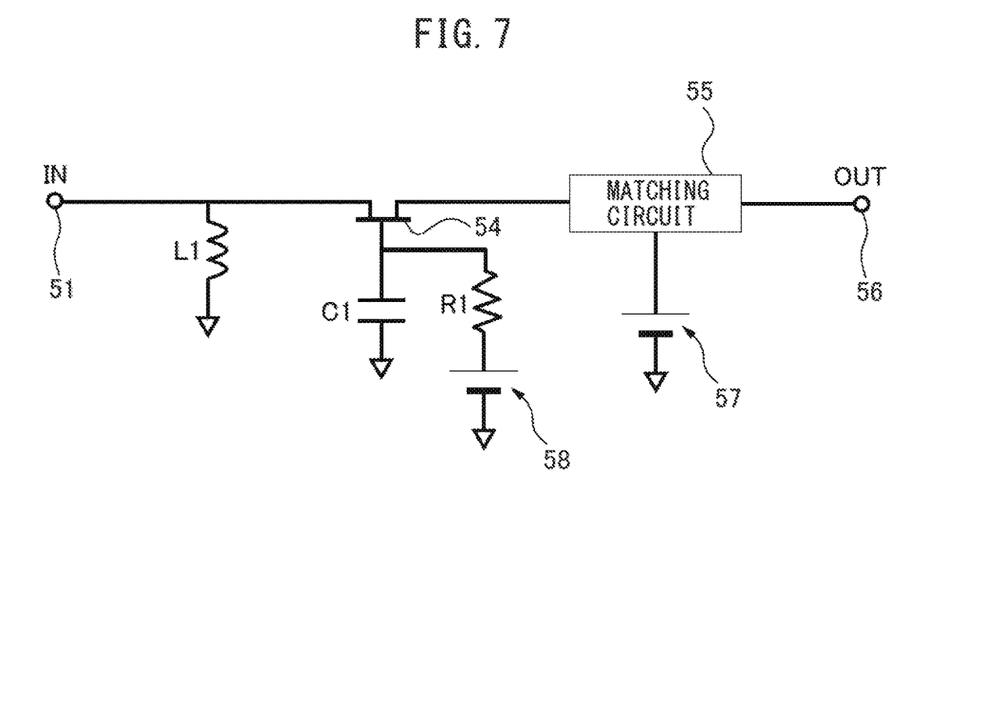
FIG. 7 is a diagram illustrating a configuration of an amplification circuit of the third embodiment.

FIG. 7 is a diagram illustrating a configuration of an amplification circuit of the third embodiment.

The amplification circuit of the third embodiment differs from the amplification circuit of the second embodiment in that the resistor R1 is not connected to the first reference voltage source (GND) but connected to a voltage source 58 that outputs a positive gate bias voltage V3. Thus, the operation point of the amplification circuit is shifted by V3 toward the positive side and when the input signal has a negative voltage, the voltage between the gate and the source of the FET 54 becomes high, but as explained in FIG. 5A and FIG. 5B, due to the voltage drop by the resistor R1, the gate voltage decreases, and therefore the FET 54 is not destroyed. The dynamic range of the amplification circuit of the third embodiment is wider than that of the amplification circuit of the second embodiment.

Figure 8:
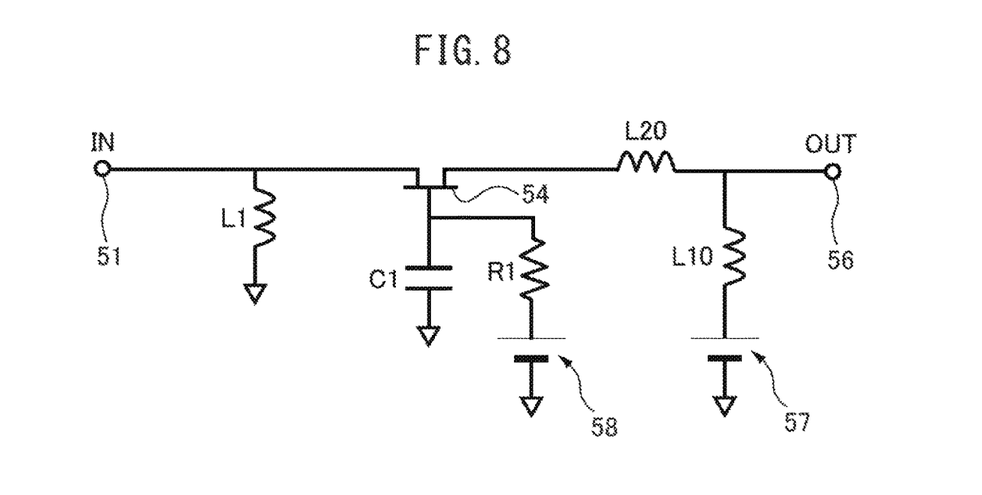
FIG. 8 is a diagram illustrating a configuration of an amplification circuit of the fourth embodiment.

FIG. 8 is a diagram illustrating a configuration of an amplification circuit of the fourth embodiment.

The amplification circuit of the fourth embodiment is obtained by implementing the output side matching circuit 55 by an inductance element L20 in the amplification circuit of the third embodiment. In the amplification circuit of the fourth embodiment, as in FIG. 6A, a connection node of the inductance element L20 and the output port 56 is connected to the voltage source 57 that outputs the voltage V2 via the inductance element L10. Thus, the output signal becomes a signal that changes with V2 as a center value. Thus, it can be said that the output side matching circuit 55 is formed not only by the inductance element L20 but also by the inductance element L10 and the voltage source 57.

Figure 9:
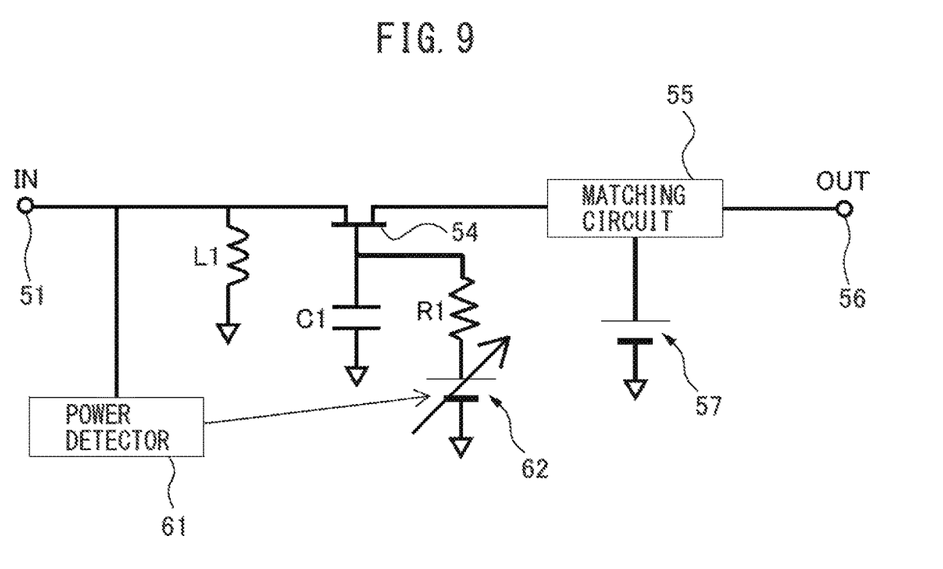
FIG. 9 is a diagram illustrating a configuration of an amplification circuit of the fifth embodiment.

FIG. 9 is a diagram illustrating a configuration of an amplification circuit of the fifth embodiment.

The amplification circuit of the fifth embodiment has a configuration in which the power source 58 is replaced with a power source 62 whose output voltage is variable and a power detector 61 configured to detect power (amplitude) of an input signal that is input to the input port 51 is provided in the amplification circuit of the third embodiment. In accordance with the power of an input signal detected by the power detector 61, the voltage output by the power source 62 is changed. Specifically, when the power of the input signal is large, the voltage output by the power source 62 is increased and when the power of the input signal is small, the voltage output by the power source 62 is reduced.

In the amplification circuit of the fifth embodiment, the gate voltage of the FET 54 is always set appropriately in accordance with the power of an input signal.

When the amplification circuits of the first to fifth embodiments explained above are used, the amplification circuits may be connected in multiple stages in order to implement a high amplification factor.

Figure 10:
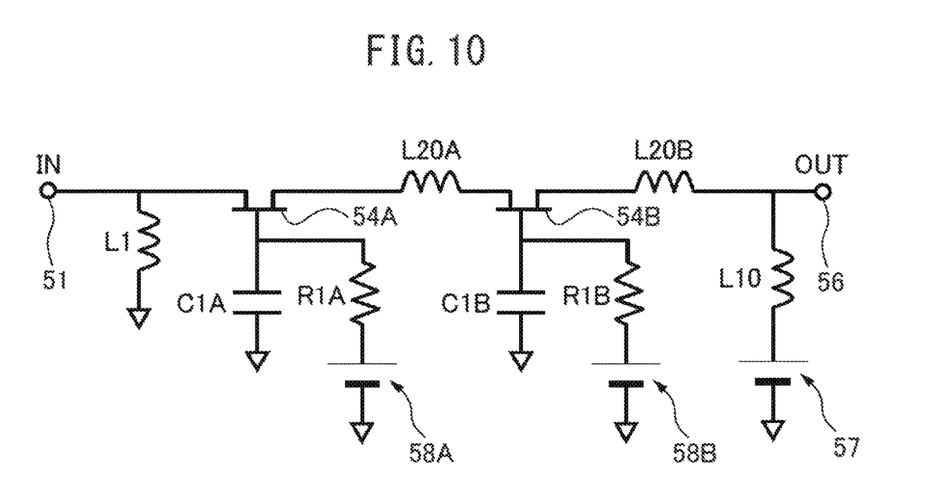
FIG. 10 illustrates a configuration in which the amplification circuits of the fourth embodiment are connected in two stages.

FIG. 10 illustrates a configuration in which the amplification circuits of the fourth embodiment are connected in two stages. The one inductance element L1 forming the input side matching circuit is provided corresponding to the input port 51. Further, one set of the inductance element L10 and the power source 57 forming the output side matching circuit is provided corresponding to the output port 56.

As above, the first to fifth embodiments are explained and for the amplification circuits of part of the embodiments, the effect was checked by a simulation.

Figure 11:
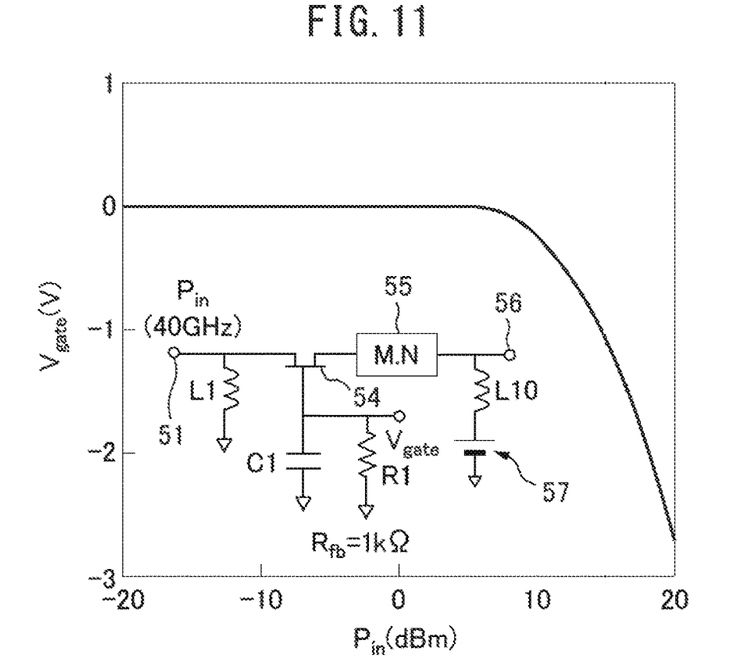
FIG. 11 illustrates simulation results for the amplification circuit of the second embodiment and specifically, illustrates simulation results by the circuit illustrated in FIG. 6A.

FIG. 11 illustrates simulation results for the amplification circuit of the second embodiment and specifically, illustrates simulation results by the circuit illustrated in FIG. 6A.

The simulation results are obtained by monitoring the voltage ($V_{gate}$) of the gate terminal, when the input signal $P_{in}$ is a sinusoidal signal whose frequency is 40 GHz, the resistance value ($R_{fb}$) of R1 is set to 1 kΩ), and the level (amplitude) of the input signal $P_{in}$ is changed from −20 dBm to +20 dBm. As illustrated in FIG. 11, it is confirmed that when the signal power is increased to 10 dBm or higher, the gate voltage $V_{gate}$ decreases.

Figure 12:
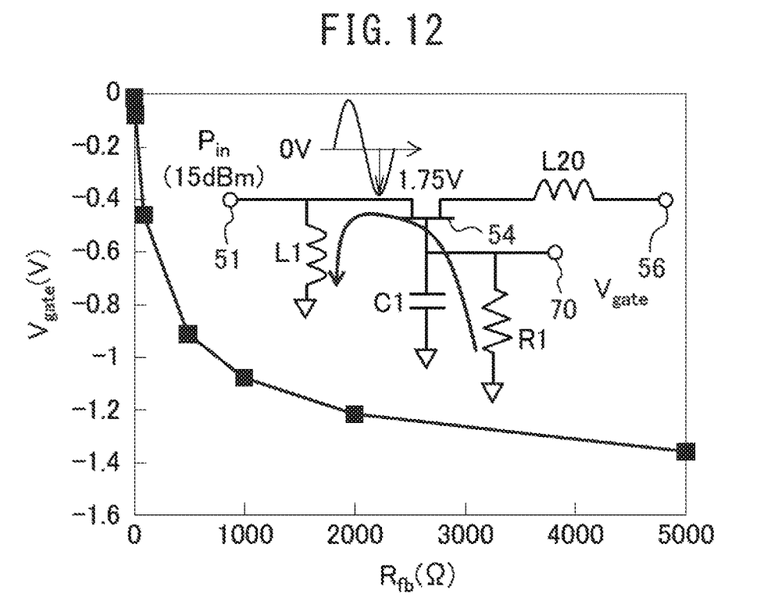
FIG. 12 illustrates simulation results for the amplification circuit of the second embodiment and specifically, illustrates simulation results when the output side matching circuit 55 is implemented by the inductance element L20 in the circuit illustrated in FIG. 6A.

FIG. 12 illustrates simulation results for the amplification circuit of the second embodiment and specifically, illustrates simulation results when the output side matching circuit 55 is implemented by the inductance element L20 in the circuit illustrated in FIG. 6A.

The simulation results indicate the change in the gate voltage, when the input signal $P_{in}$ is a sinusoidal signal whose frequency is 40 GHz and the resistance value ($R_{fb}$) of R1 is changed from 0 to 5 kΩ) in the state where the input power is fixed to 15 dBm. When the input power is fixed to 15 dBm, if the load impedance is set to 50Ω, the voltage of the sinusoidal signal changes between −1.75 V and +1.75 V.

As illustrated in FIG. 12, it may be confirmed that the gate voltage decreases by increasing the resistance value. For example, if it is assumed that the transistor is destroyed when a voltage of 0.7 V is applied between the gate and the source, when $R_{fb}$ is 0Ω, when the input power becomes 7 dBm (voltage amplitude ±1.4 V) or higher, the transistor is destroyed. In contrast to this, by setting $R_{fb}$ to 1 kΩ), the minimum value of the source voltage becomes −1.75 V for the input power of 15 dBm and $V_{gate}$ decreases to −1.2 V. Thus, the voltage between the gate and the source becomes 0.5 V, and therefore destruction is avoided.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to an illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplification circuit comprising:
   a field effect transistor;
   an input side matching circuit connected between an input port and a source terminal of the field effect transistor and configured to output an input signal that changes with a bias voltage as a center value;
   an output side matching circuit connected between an output port and a drain terminal of the field effect transistor;
   a capacitor connected between a gate terminal of the field effect transistor and a first reference voltage source;
   a resistor connected between the gate terminal of the field effect transistor and the first reference voltage source; and
   a gate bias voltage source connected between the resistor and the first reference voltage source and configured to apply a gate bias voltage to the gate terminal via the resistor.

2. The amplification circuit according to claim 1, wherein
   the input side matching circuit includes a choke coil whose first end is connected to a node between the input port and the source terminal and whose second end is connected to the first reference voltage source, and
   the bias voltage is a voltage of the first reference voltage source.

3. The amplification circuit according to claim 1, wherein
   the gate bias voltage source changes the gate bias voltage,
   the amplification circuit further comprises a power detector of a signal of the input port, and
   the gate bias voltage source decreases the gate bias voltage when an amount of detected power detected by the power detector becomes large.

* * * * *